United States Patent
Kim et al.

(10) Patent No.: US 10,020,370 B2
(45) Date of Patent: Jul. 10, 2018

(54) RING-TYPE FIELD EFFECT TRANSISTOR FOR TERAHERTZ WAVE DETECTION, WHICH USES GATE METAL AS ANTENNA

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Min Woo Ryu, Ulsan (KR); Sang Hyo Ahn, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/561,940

(22) PCT Filed: Dec. 31, 2015

(86) PCT No.: PCT/KR2015/014578
§ 371 (c)(1),
(2) Date: Sep. 26, 2017

(87) PCT Pub. No.: WO2017/115896
PCT Pub. Date: Jul. 6, 2017

(65) Prior Publication Data
US 2018/0122912 A1    May 3, 2018

(51) Int. Cl.
*H01L 31/112*    (2006.01)
*H01L 29/417*    (2006.01)
(Continued)

(52) U.S. Cl.
CPC .... *H01L 29/41758* (2013.01); *H01L 29/0847* (2013.01); *H01L 29/1033* (2013.01);
(Continued)

(58) Field of Classification Search
CPC ...................... H01L 29/41758; H01L 31/1126
(Continued)

(56) References Cited

U.S. PATENT DOCUMENTS 5,668,392 A    9/1997    Huang et al.

FOREIGN PATENT DOCUMENTS

| JP | 10289993 | 10/1998 |
|----|----------|---------|
| JP | 2010135520 | 6/2010 |

(Continued)

OTHER PUBLICATIONS

Evseev, S.B. "Ring-gate MOSFET test structures for measuring surface-charge-layer sheet resistance on high-resistivity-silicon substrates" Micro. Test Struc. 2006 ICMTS Apr. 10, 2006 pp. 3-8.*

(Continued)

*Primary Examiner* — Asok K Sarkar
*Assistant Examiner* — Grant Withers
(74) *Attorney, Agent, or Firm* — Hodgson Russ LLP

(57) ABSTRACT

A ring-type FET may include a silicon base, a source formed on a portion of the silicon base through doping, a channel formed to encompass the source on a plane, a drain formed outside the channel, a dielectric layer formed on the source, the channel and the drain, and a gate provided on the dielectric layer, wherein a center of the source is spaced apart from a center of the channel, and the gate is formed of a metal material, disposed above the channel and configured to cover an upper face of the channel and overlap a portion of the source and a portion of the drain.

5 Claims, 4 Drawing Sheets

(51) Int. Cl.
*H01L 29/423* (2006.01)
*H01L 29/10* (2006.01)
*H01L 29/78* (2006.01)
*H01L 29/08* (2006.01)

(52) U.S. Cl.
CPC .... *H01L 29/4238* (2013.01); *H01L 29/42376* (2013.01); *H01L 29/78* (2013.01); *H01L 31/1126* (2013.01)

(58) Field of Classification Search
USPC ........................................................ 438/286
See application file for complete search history.

(56) References Cited

FOREIGN PATENT DOCUMENTS

| | | |
|---|---|---|
| JP | 2012175034 | 9/2012 |
| KR | 20130133368 | 12/2013 |

OTHER PUBLICATIONS

English translation of Foreign reference JPH10289993 dated Oct. 27, 1998.*
Rizzoni, Principles and Applications of Electrical Engineering, 2007 McGraw-Hill Korea, Inc., 5th edition, p. 169, Dec. 20, 2006.

* cited by examiner

100

RING-TYPE FIELD EFFECT TRANSISTOR FOR TERAHERTZ WAVE DETECTION, WHICH USES GATE METAL AS ANTENNA

TECHNICAL FIELD

The present invention relates to a ring-type field-effect transistor (FET) for detecting a terahertz wave using a gate metal as an antenna and, more particularly, to a ring-type FET for detecting a terahertz wave using a gate metal that maximizes an asymmetric effect as an antenna.

BACKGROUND ART

To increase a sensitivity in a terahertz detector, a charge of a channel may be gathered in a two-dimensional (2D) form by a gate field effect. In general, compound semiconductors have a relatively high efficiency of forming a 2D channel charge as compared to silicon and thus, have been widely used. However, in terms of the compound semiconductors, a manufacturing cost may be higher than that of the silicon and, due to an inconvenience in an etching process for forming a shape, it is difficult to apply various asymmetric structures. Also, when using the compound semiconductors, an integration of peripheral elements such as an antenna and an amplifier may be difficult. For this reason, a commercialization of the compound semiconductor may also be difficult.

In recent years, there has been reported that a performance of a silicon field-effect transistor (FET)-based detector is improved based on improvements in performances of an antenna and an amplifier. Basically, since the silicon FET has a low power characteristic, the improvement of the reactivity of the terahertz detector may be limited when the performances of the peripheral elements are improved only.

In general, an FET-based terahertz (THz) detector may allow THz-wave signals corresponding to alternating current signals to be concentrated between two terminals, for example, a gate G and a source S of three external connection terminals, for example, the gate G, the source S, and a drain D of an FET. Through this, the FET-based THz detector may obtain an asymmetry in an amount of charge in a lower semiconductor channel area between the source and the drain. Based on such asymmetric charge distribution, the FET-based THz detector may detect a photoresponse using a direct current (DC) voltage of an output terminal, for example, the drain D, thereby detecting a signal.

As the foregoing, to obtain the asymmetry in the amount of charge for increasing a reactivity of the FET-based THz detector, an efficiency of an antenna for receiving a THz wave may increase and a gain of an amplifier amplifying a voltage of the output terminal, the drain D may also increase. Even if the aforementioned scheme is used, the output voltage of the FET that is based on a symmetric structure may be susceptible to noise and thus, a degree of improvement of the reactivity may be relatively small.

When the FET is fabricated in a self-aligned gate structure, which is an advantage of a silicon process, source/drain areas overlapping the gate may need to be asymmetric after the gate has been formed. Also, an additional complex mask process such as an ion implantation process of overlapping for ultrafine and high-performance elements may be required to change either the source/drain areas overlapping the gate. Due to an isotropic diffusion of the ions implanted for such asymmetry, an asymmetry rate of the source/drain facing the gate corresponding to a terminal receiving the THz wave may be reduced and thus, a charge asymmetry effect may be insignificantly high.

A gate sidewall process (of a gate overlapping a lower channel) for an underlap for a high-voltage power device may also effectively control the asymmetry effect by adjusting a thickness of a sidewall. In an underlap structure, the asymmetry effect of the gate following a generation of the underlap may be insignificant and a resistance of an element may increase, which may lead to an increase in noise equivalent power.

Although the asymmetric source/drain area is created based on a self-aligned gate structure which is a main method of a typical silicon technology-based FET process, the asymmetric source/drain area facing the gate corresponding to the terminal receiving the THz-wave may have little or no change and thus, the charge asymmetry effect may be significantly reduced. Accordingly, to achieve the asymmetric structure of a channel area between the source and the drain of the silicon-based FET and, simultaneously, effectively realize the asymmetry structure for the source/drain area facing the gate, there is a desire for an additional method differing from a typical self-alignment method. For example, Korean Laid-open Patent No. 2013-0133368 discloses a terahertz detector for maximizing an asymmetry effect.

The aforementioned patent has an advantageous characteristic in configuring a source/drain area in an asymmetric form to increase a sensitivity of a detector. However, an additional process may be required to asymmetrically construct a source/drain and a gate based on a quadrangular shape.

DISCLOSURE OF INVENTION

Technical Goals

An aspect of the present invention provides a ring-type field-effect transistor (FET) for detecting a terahertz wave using a gate metal as an antenna, the ring-type FET which obtains an asymmetry based on shapes of a source/drain, and a gate to achieve a high sensitivity and, additionally, uses the gate as an antenna such that a gate metal that is convenient in terms of production is used as the antenna.

Technical Solutions

According to an aspect of the present invention, there is provided a ring-type field-effect transistor for detecting a terahertz wave using a gate metal as an antenna, the ring-type field-effect transistor including a silicon base, a source formed on a portion of the silicon base through doping, a channel formed to encompass the source on a plane, a drain formed outside the channel, a dielectric layer formed on the source, the channel and the drain, and a gate provided on the dielectric layer, wherein a center of the source is spaced apart from a center of the channel, and the gate is formed of a metal material, disposed above the channel and configured to cover an upper face of the channel and overlap a portion of the source and a portion of the drain.

The source may be in a circular shape and the channel may be in a ring shape.

The gate may be formed in the same shape as the channel, overlap the source by a width of the source, and overlap the drain by a width of the drain.

The width by which the gate overlaps the source may be different from the width by which the gate overlaps the drain.

The ring-type field-effect transistor may further include a source metal disposed on an upper face of the source and electrically connected to the source.

The source metal may be in a circular shape and electrically separated from the gate.

Effects

According to an aspect of the present invention, it is possible to provide a ring-type field-effect transistor (FET) for detecting a terahertz wave using a gate metal as an antenna, the ring-type FET which forms a channel to encompass a source in order to obtain an asymmetry based on a geometric form, additionally obtains the asymmetry by adjusting an overlap area between the channel and a gate and an overlapping area between the gate and the source, freely sets each parameter for defining a shape, and uses a metal gate as an antenna without need to employ an antenna as an additional element, so as to implement a high-degree of integration.

BEST MODE FOR CARRYING OUT THE INVENTION

Figure 1:
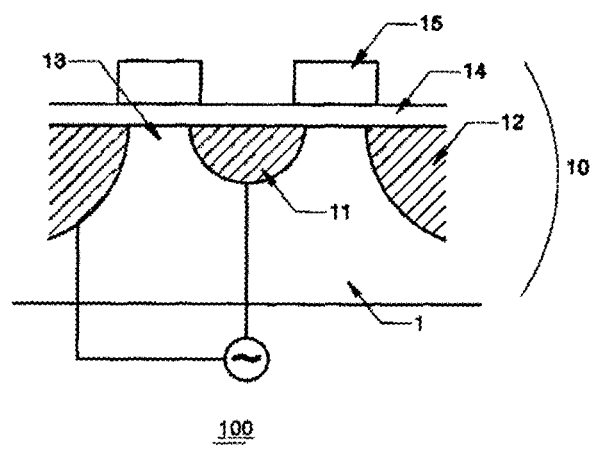
FIG. 1 is a cross-sectional view of a ring-type field-effect transistor (FET) for detecting a terahertz wave using a gate metal as an antenna according to the present invention.

Reference will now be made in detail to embodiments of the present invention, examples of which are illustrated in the accompanying drawings, wherein like reference numerals refer to the like elements throughout.

Referring to FIG. 1, a ring-type field-effect transistor (FET) 10 for detecting a terahertz wave using a gate metal as an antenna may include a source 11, a drain 12, a channel 13, a dielectric layer 14, and a gate 15 formed on a silicon base 1. Hereinafter, the ring-type FET 10 is also referred to as an FET 10.

An impurity may be doped into each of the source 11 and the drain 12. The dielectric layer 14 may be formed of a material generally applicable to an FET. The gate 15 may be formed of a metal to function as an antenna.

A terahertz electromagnetic wave may be applied to the gate 15. In this instance, a property of the terahertz electromagnetic wave applied by a voltage generated between the source 11 and the drain 12 may be detected.

Depending on examples, a source metal 16 may be formed on the source 11. The source metal 16 may be electrically connected to the source.

Figure 2:
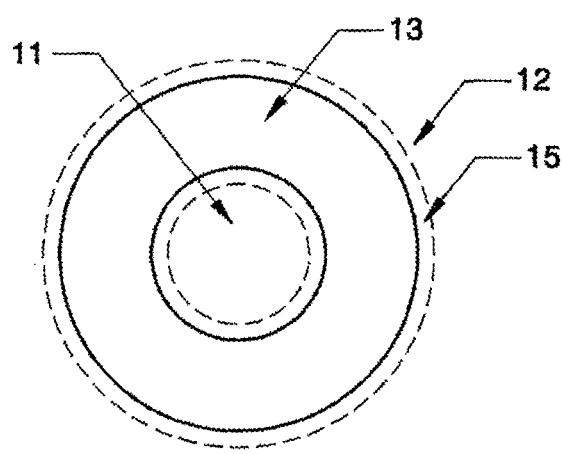
FIG. 2 is a top view illustrating a source, a channel, and a drain of FIG. 1.

As illustrated in FIG. 2, the FET 10 may include the source 11 formed in a circular shape, and the channel 13 formed to encompass the source 11.

Similarly, the channel 13 may also be formed in the circular shape. A center of the source 11 and a center of the channel 13 may be located at different positions and thus, an asymmetry may be maximized.

Thus, the source 11 may be isolately provided, and an electrode may be connected via an upper face of the source 11. A cross-section of the source 11 may extend to a lower face of the base 1 such that the electrode is connected via a lower end as necessary.

When a diameter of the source 11 is d1, a diameter of the channel 13 is d2, a minimum distance between an external diameter of the source 11 and an internal diameter of the channel 13 is Lg, and a maximum distance between the external diameter of the source 11 and the internal diameter of the channel 13 is L, d2 may be equal to a sum of d1, Lg, and L.

As such, in the FET 10, L may differ from Lg. When the center of the source 11 and the center of the channel 13 are differently located, the FET 10 may have a structure in which a difference in arrival distance of the charge from the source 11 to the drain 12 varies from Lg to L and thus, an electric field between the gate 15 and the source 11 may be enhanced.

Figure 3:
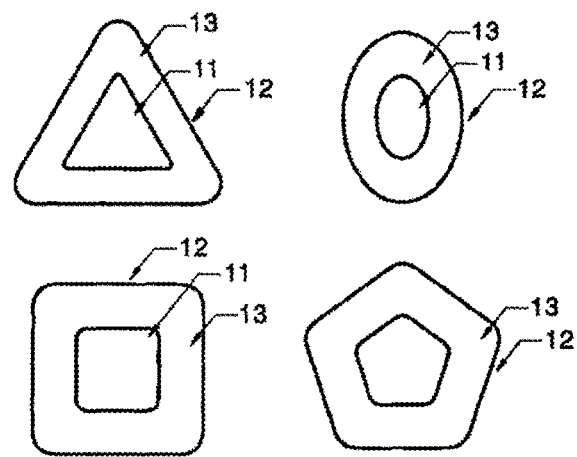
FIG. 3 illustrates an example of FIG. 2 to which a gate is added.

As illustrated in FIG. 3, the gate 15 may be formed in the same shape as the channel 13, and may include a portion e1 overlapping the source 11 and a portion e2 overlapping the drain 12.

In this example, when the portion e1 is not equal to the portion e2, the asymmetry may increase. Also, when the portion e1 is similar to the portion e2 in size, an overall asymmetry may be secured based on the asymmetry of the shapes of the source 11 and the drain 12.

When the portions e1 and e2 are greater than 0, the asymmetry may also increase.

As the foregoing, since the gate 15 is formed in a ring shape, the gate 15 may be used as an antenna having isotropic characteristics with respect to a polarization of the terahertz wave. Thus, in contrast to the conventional FET, a separate antenna structure may not be required.

Figure 4:
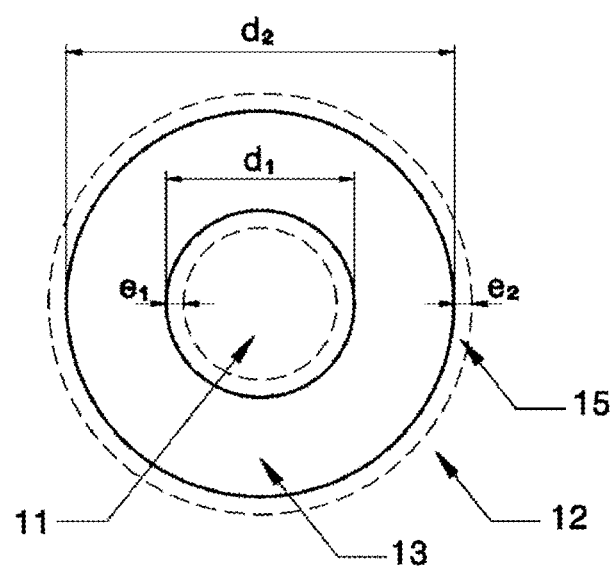
FIG. 4 illustrates an example of FIG. 3 to which a source metal is added.

As illustrated in FIG. 4, when the source metal 16 is formed on the source 11, a characteristic impedance design may be applicable by adjusting a minimum distance dm between the source metal 16 and the gate 15 and thus, an impedance matching may be performed on the FET 10 at a lower end of the gate 15.

Through this, the gate 15 may be used as an antenna without need to use a separate antenna structure. Also, the asymmetric structure of the gate 15 may allow the terahertz wave to be concentrated between a short interval between the gate 15 and the source metal 16 and guide the terahertz wave asymmetrically entering the FET 10.

As described above, the ring-type FET 10 for detecting a terahertz wave using a gate metal as an antenna may be configured based on silicon process technology and thus, differentiated from a high-cost compound semiconductor having its own high quality. Therefore, an integration of the FET 10 with peripheral elements such as an antenna and an amplifier for an additional performance improvement is technically implementable. Also, high-sensitivity silicon-based large-area multi-pixel array type detector integration is implementable at low costs.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A ring-type field-effect transistor comprising:
   a silicon base;
   a source formed on a portion of the silicon base through doping;

a channel formed to encompass the source on a plane;
a drain formed outside the channel;
a dielectric layer formed on the source, the channel and the drain; and
a gate provided on the dielectric layer;
wherein a center of the source is spaced apart from a center of the channel, and the gate is formed of a metal material, disposed above the channel and configured to cover an upper face of the channel and overlap a portion of the source and a portion of the drain;
wherein the ring-type field-effect transistor is configured to detect a terahertz wave using the gate as an antenna;
wherein the source is in a circular shape and the channel is in a ring shape.

2. The ring-type field-effect transistor of claim 1, wherein the gate is formed in the same shape as the channel, overlaps the source by a width of the source, and overlaps the drain by a width of the drain.

3. The ring-type field-effect transistor of claim 2, the width by which the gate overlaps the source is different from the width by which the gate overlaps the drain.

4. The ring-type field-effect transistor of claim 3, further comprising:
a source metal disposed on an upper face of the source and electrically connected to the source.

5. The ring-type field-effect transistor of claim 4, wherein the source metal is in a circular shape and electrically separated from the gate.

* * * * *